United States Patent [19]

Harwood et al.

[11] Patent Number: 4,961,050
[45] Date of Patent: Oct. 2, 1990

[54] TEST FIXTURE FOR MICROSTRIP ASSEMBLIES

[75] Inventors: Warren K. Harwood, Vancouver, Wash.; Keith E. Jones, Beaverton; Daniel DeLessert, Newberg, both of Oreg.

[73] Assignee: Cascade Microtech, Inc., Beaverton, Oreg.

[21] Appl. No.: 309,698

[22] Filed: Feb. 10, 1989

[51] Int. Cl.$^5$ .............. G01R 1/02; G01R 1/04
[52] U.S. Cl. .............. 324/158 F; 324/72.5; 324/158 P; 333/260
[58] Field of Search .............. 324/158 F, 158 P, 72.5, 324/637, 642; 333/33, 260

[56] References Cited

U.S. PATENT DOCUMENTS

| | | | |
|---|---|---|---|
| 3,201,721 | 8/1965 | Voelcker | 333/33 |
| 4,009,456 | 2/1977 | Hopfer | 333/260 |
| 4,280,112 | 7/1981 | Eisenhart | 333/21 R |
| 4,365,195 | 12/1982 | Stegens | 324/158 F |
| 4,810,981 | 3/1989 | Herstein | 333/260 |

OTHER PUBLICATIONS

Adjustable Microstrip Test Fixture—Advertisement on p. 297 of "Microwave Journal", Sep. 1988 issue.
Design Technique Product Information Sheet, "Adjustable Test Fixture"—1988.
Design Technique Product Information Sheet, "Microstrip Microwave Test Fixture"—May 1986.
Inter-Continental Microwave Application Note: 101—Microwave Semi-Conductor Chip Measurements Using the HP 8510B TRL-Calibration Technique (undated).
Inter-Continental Microwave Product Catalog—Apparent Date 1/86, particularly pp. 14–16 and 21–24.
Maury Microwave Corporation Product Information Sheet on Universal Transistor Test Fixture MT950 Series—dated May 31, 1985.
Maury Microwave Corporation Product Information Sheet on Universal Transistor Test Fixture MT950 Series—dated Oct. 7, 1982.

*Primary Examiner*—Reinhard J. Eisenzopf
*Assistant Examiner*—William Burns
*Attorney, Agent, or Firm*—Chernoff, Vilhauer, McClung & Stenzel

[57] ABSTRACT

A test fixture for testing microstrip assemblies and similar electronic circuit components and assemblies under application of high-frequency signals introduced through launchers whose positions are adjustable in the test fixture to accommodate circuit assemblies of different sizes and different geometry. An easily operated rapid connector positioning mechanism moves connectors which complete electrical connection between outer conductors of the launchers and a ground plane conductor of a microstrip assembly. The connectors also lift the microstrip assembly and support it while electrical connection is completed, without the need for a carrier beneath the test assembly. A lid is moved in coordination with operation of the connector positioning mechanism to provide electrical contact to a third point on the upper face of a circuit assembly to be tested.

36 Claims, 5 Drawing Sheets

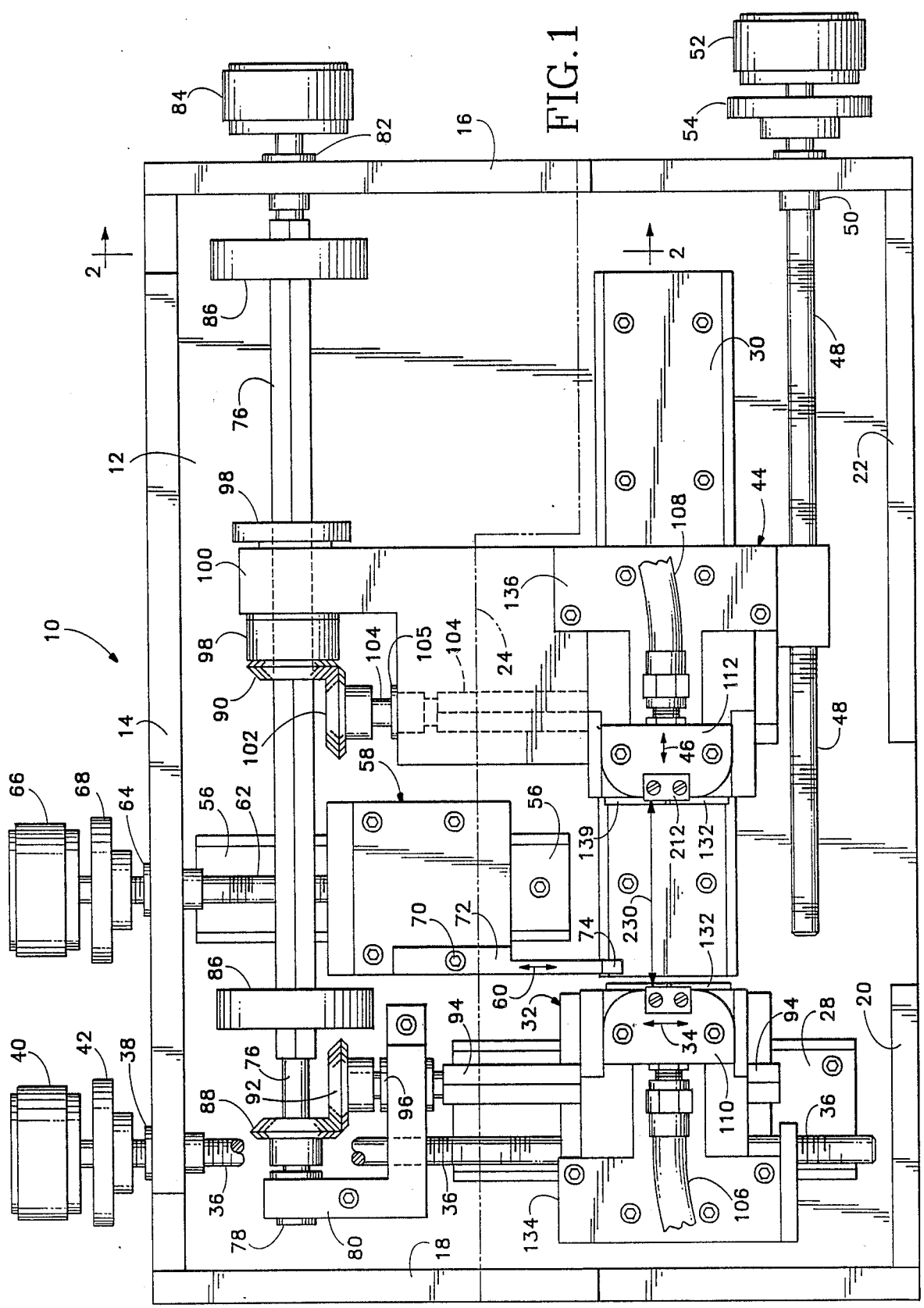

TEST FIXTURE FOR MICROSTRIP ASSEMBLIES

BACKGROUND OF THE INVENTION

The present invention relates to electronic component testing, and particularly to a test fixture for holding microstrip hybrid circuits and other microstrip assemblies in such a way that the assemblies can be tested reliably by application of high-frequency signals, with repeatable results.

Test fixtures are currently available which can test small circuit components including microstrip assemblies, but currently available fixtures present certain difficulties in achieving reliable test results. Typical microstrip assemblies include a dielectric substrate in the form of a sheet, with a copper cladding or other conductive material extending over the full area of its bottom face as a ground plane conductor. A much narrower conductive strip, usually with interposed circuit components, is located on the top face of the dielectric sheet to carry the desired signals. Since the geometries of both the microstrip assembly and its input/output connections are critical to its impedance, it is extremely important that test connections to such microstrip assemblies be accomplished precisely at the intended places and essentially identically for each individual microstrip assembly of a series being tested.

Typically, input/output connections to a microstrip assembly to be tested are made by means of launchers, which mate with coaxial cables and are designed to conduct high-frequency signals while maintaining a characteristic impedance through the transition from coaxial cable to microstrip assembly. The surface area presented by the edge of the ground plane conductor of a microstrip assembly is extremely small and makes connection directly between a launcher and the ground plane conductor unreliable, using previously available technology, unless a conductive carrier is provided beneath the microstrip assembly in abutment with the ground plane. Previously available test fixtures therefore require that microstrip assemblies be mounted on such a carrier, which provides for connection with the ground plane conductor while also compensating for any variations in substrate thicknesses. Fastening such microstrip assemblies to carriers, however, requires excessive time and adds to the cost of testing. Likewise, manually positioning probes or other connectors to introduce bias voltages and the like during testing requires more time than desired.

Currently available testing fixtures for microstrip assemblies also suffer from difficulty in achieving reliable repeatability of test results, because of such factors as wear to contact surfaces due to repeated connection and disconnection of the microstrip assemblies, and critical requirements for alignment of the microstrip assemblies relative to the launchers. Thus, previously available test fixtures for microstrip circuit assemblies cannot be relied upon to present the same impedance in electrical connections to several different microstrip test assemblies of identical structure unless extraordinary, time-consuming care is exercised.

A drawback to flexible use of the available test fixtures is that their connectors, for making detachable electrical interconnection with microstrip devices being tested, are arranged coaxially with one another, and are thus difficult to use where contacts on the device to be tested are not located coaxially.

What is needed, then, is a durable, high-production test fixture which is able rapidly to interconnect launchers detachably to microstrip assemblies with predictably reliable and repeatable results. Such a test fixture should be able to test microstrip assemblies without the need for carriers (although they may be used if desired), and to test assemblies of different sizes and including opposite terminal portions which are not coaxial. It is also desired to provide such a test fixture which automatically compensates for different thicknesses of substrates of microstrip assemblies to be tested, which provides for rapid insertion and removal of assemblies to be tested with a minimum of wear on connecting surfaces, and which provides for coordinated and precise electrical interconnection with test assemblies at points other than the terminals of the microstrip conductor.

SUMMARY OF THE INVENTION

The present invention provides an improvement in test fixtures for testing electronic circuit components such as microstrip assemblies and the like, which overcomes the aforementioned deficiencies of the previously available devices and fixtures. In accordance with the present invention, a preferred embodiment of the test fixture includes a pair of launchers each mounted on a separate carriage, with the carriages separately being precisely adjustable, one in an X-axis direction, and the other in a Y-axis direction in a single plane, in order to receive and test microstrip circuit assemblies of greatly different dimensions and terminal alignments. Connectors and connector positioning mechanisms cooperate with the launchers to detachably and rapidly connect a microstrip assembly to the launchers electrically with improved reliability and without the need for a carrier.

The need for a carrier is eliminated by providing ground plane connectors, movably mounted on the launchers, which have horizontal contact surfaces adapted to extend in an overlapping, parallel, abutting relation to the ground plane of each microstrip test assembly. Connector positioning mechanisms raise each connector toward the ground plane, and thereafter move each connector a small distance substantially horizontally toward the launcher, thereupon dependably making an electrical interconnection between a vertical contact surface of the connector and a vertical surface of the outer conductor of the launcher. Preferably, the connectors also supportingly raise the microstrip assembly as the connectors are being raised, thereby moving the upper conductor of the microstrip assembly into connection with the inner conductor of the launcher. Because each connector is held a small distance away from the vertical contact surface of the launcher until the device to be tested has been positioned, wear on the vertical contact surfaces of the connector and launcher is minimized, contributing to durability of the test fixture and reliability of test results obtained through its use. The connector positioning mechanisms associated with the launchers are operated in precisely synchronized coordination with each other through mutual interconnection, and also function to lower a probe contact to a desired position on the upper surface of the microstrip test assembly to make contact at about the same time when connection is being completed between the ground plane conductor of the assembly and the outer conductors of the launchers. Springs in the connector positioning mechanisms compensate automatically for different substrate thicknesses in different microstrip test assemblies while yieldably applying contact force between respective contact surfaces to achieve and maintain electrical interconnection.

It is therefore a principal object of the present invention to provide an improved fixture for use in testing high-frequency circuit component assemblies such as microstrip assemblies.

It is another principal object to provide such a text fixture able to provide rapid, reliable and precise interconnection between launchers and assemblies to be tested without the need to mount such assemblies on carriers prior to testing.

It is another important object of the present invention to provide a test fixture which is easily adjustable to accommodate devices of many different sizes, thicknesses and terminal alignments for testing.

It is a further object of the present invention to provide improved repeatability of tests by more reliably providing for identical electrical contact with the conductors of different test devices such as microstrip circuit assemblies.

It is a further object of the invention to provide such improved repeatability through the use of rapidly engageable and wear-resistant detachable connectors.

It is a further object of the present invention to provide a mechanism for placing a probe on a microstrip circuit assembly to be tested, automatically in coordination with connection of the assembly to the launchers in order to provide a biasing voltage or signal to a portion of the assembly located between the terminals to which the launchers are connected.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 1 is a top plan view of a test fixture for testing microstrip assemblies which embodies the present invention.

DETAILED DESCRIPTION OF THE INVENTION

Figure 3:
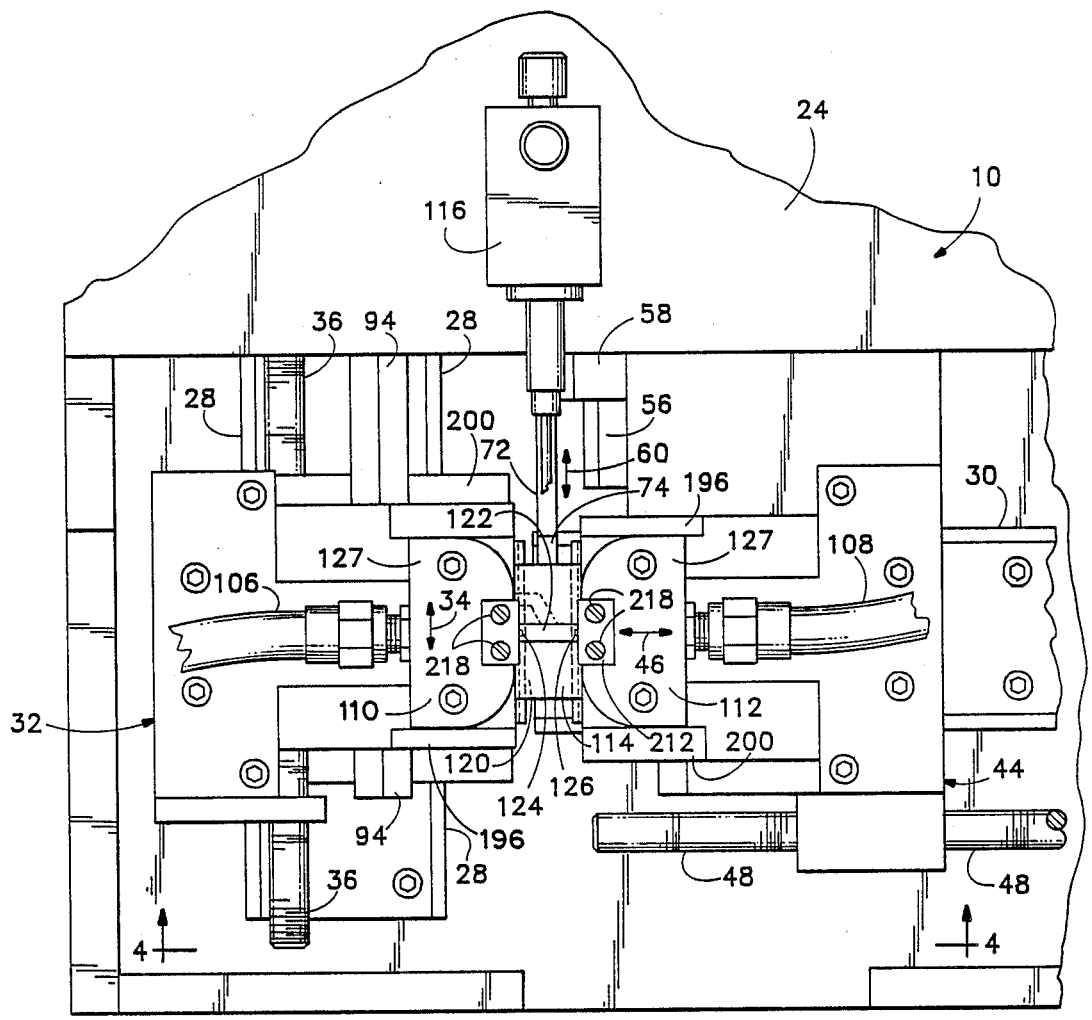
FIG. 3 is a top plan view of a portion of the test fixture shown in FIG. 1, at an enlarged scale, with a microstrip circuit assembly in place in the test fixture.

Referring now to the drawings which form a part of the disclosure, a test fixture 10 shown in FIG. 1 includes a frame or base having a bottom 12 defining a base plane. An upstanding side wall 14, an end wall 16, an opposite end wall 18, and partial wall segments 20 and 22 are attached to the bottom 12, forming an enclosure which is upwardly open, except for a portion covered by a carrier lid 24, shown in phantom line in FIG. 1. The carrier lid 24 extends from the wall 14 a portion of the distance toward the partial walls 20 and 22, as may be seen in FIG. 2, and is hingedly attached to the frame by hinges 26 establishing a hinge axis parallel with the base plane and the wall 14.

A Y-axis track 28 is fixedly mounted on the bottom 12, as is an X-axis track 30, which extends perpendicular to the Y-axis track 28, both being parallel with the base plane defined by the bottom 12. A Y-axis carriage assembly 32 is mounted slidably upon the Y-axis track 28 and is reciprocally movable therealong in the directions indicated by the arrow 34, in response to rotation of a threaded shaft 36 which extends through the wall 14, where it is rotatably carried in a suitable combination thrust and radial bearing 38. The threaded shaft 36 extends through a threaded bore in the Y-axis carriage, and is rotatable by a Y-axis position adjustment knob 40 mounted on the threaded shaft 36 outside the wall 14. A locking mechanism (not shown in detail) is operated by a locking knob 42 associated with the threaded shaft 36 to prevent rotation of the threaded shaft 36 once the Y-axis carriage 32 has been placed in the desired position.

An X-axis carriage 44 is mounted on the X-axis track 30, on which it is slidable in the directions indicated by the arrow 46, under the control of a threaded shaft 48 which extends through the wall 16 and is supported in bearing 50. The threaded shaft 48 is engaged in a threaded bore defined in the X-axis carriage 44 and can be turned by means of an X-axis carriage position adjustment knob 52. Like the threaded shaft 36, the shaft 48 may be locked in place once the shaft 48 has been adjusted as desired, by means of an X-axis locking knob 54 located on the threaded shaft 48 adjacent the knob 52.

A fence carriage track 56 is mounted on the bottom 12, and a fence carriage 58 mounted slidably upon the fence carriage track 56 is movable parallel with the bottom 12 in the directions indicated by the arrow 60, under the control of a threaded shaft 62 which extends through the wall 14, where it is supported in a bearing 64. The threaded shaft 62 is engaged in a threaded bore carried on the fence carriage 58 and is rotatable by means of a knob 66. The shaft 62 may be locked in a selected position by means of a fence carriage locking knob 68. Attached to the fence carriage 58 by a suitable removable fastener, such as a bolt 70, is a fence arm 72 carrying a fence 74, which extends vertically upward from the distal end of the fence arm 72 as an adjustable stop for establishing a reference position for initial placement of a device such as a microstrip assembly to be tested. The fence arm 72 may be removed from the fence carriage 58 for replacement by one including a fence 74 which is wider, i.e., which extends further in the X-axis direction, for use with a microstrip assembly of large size.

A main operating control shaft 76 extends toward the wall 16 from a first end carried rotatably in a bearing 78 located in a bearing support member 80 which is fixedly mounted on the bottom 12. The shaft 76 is further supported by a bearing 82 located in the wall 16, and a main operating lever 84 is fixedly mounted on the shaft 76 outside the wall 16, in order to rotate the shaft 76.

Figure 2:
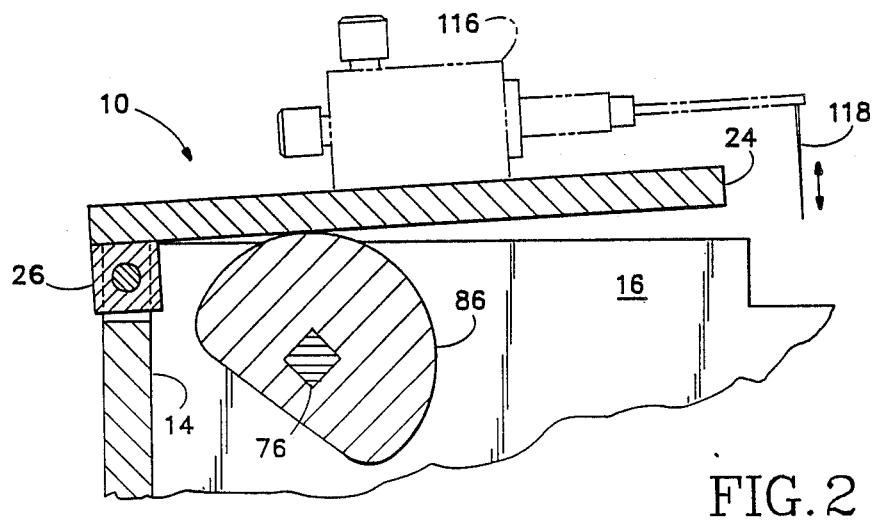
FIG. 2 is a sectional view, taken along line 2—2 of FIG. 1, showing the cam arrangement for raising and lowering a lid carrying a probe for providing a third connection to a device being tested.

Mounted on the main operating control shaft 76 for rotation therewith are a pair of carrier lid lifting cams 86, one of which is also shown in FIG. 2. Also carried on the shaft 76 for rotation therewith are two bevel gears, a Y-axis carriage driving bevel gear 88, and an X-axis carriage driving bevel gear 90.

Meshed with the Y-axis carriage driving bevel gear 88 is a Y-axis carriage driven bevel gear 92, which is mounted fixedly on a Y-axis connector drive shaft 94 for rotation therewith. The Y-axis connector drive shaft 94 is supported in a bearing 96 located in the support member 80 and extends parallel with the threaded shaft 36, being engaged drivingly with a connector positioning operating mechanism carried on the Y-axis carriage 32, as will be explained more fully presently.

A sleeve 98 mounted on the main operating control shaft 76 so as to rotate with the shaft but be slidable therealong connects the X-axis carriage driving bevel gear 90 to the shaft 76 for rotation therewith. The sleeve 98 is journaled for rotation within a bearing support 100, which is a part of the X-axis carriage 44. The bearing support 100 carries the sleeve 98 along the main operating control shaft 76, as the X-axis carriage 44 is moved along the track 30. The X-axis carriage driving bevel gear 90 is mounted fixedly on the sleeve 98 and thereby rotates with the shaft 76.

Meshed with the X-axis carriage driving bevel gear 90 is an X-axis carriage driven bevel gear 102, which is fixedly mounted on an X-axis connector drive shaft 104, a first end of which is supported for rotation in a bearing 105 carried in the X-axis carriage 44.

A pair of coaxial transmission cables 106 and 108 are connected respectively to launchers 110 and 112 mounted, respectively, on the Y-axis carriage 32 and the X-axis carriage 44, to carry electromagnetic signal waves to and from a device to be tested, such as the microstrip assembly 114 shown in FIG. 3.

As may be seen in FIGS. 2 and 3, a device such as a probe assembly 116 may be mounted by suitable adjustable attachment, such as by use of magnets, atop the carrier lid 24 for movement therewith. The position of a contact member 118 which is a portion of the probe 116 may be adjusted precisely by adjustment knobs 50 once the probe 116 or similar device is fastened to the carrier lid 24.

Figure 4:
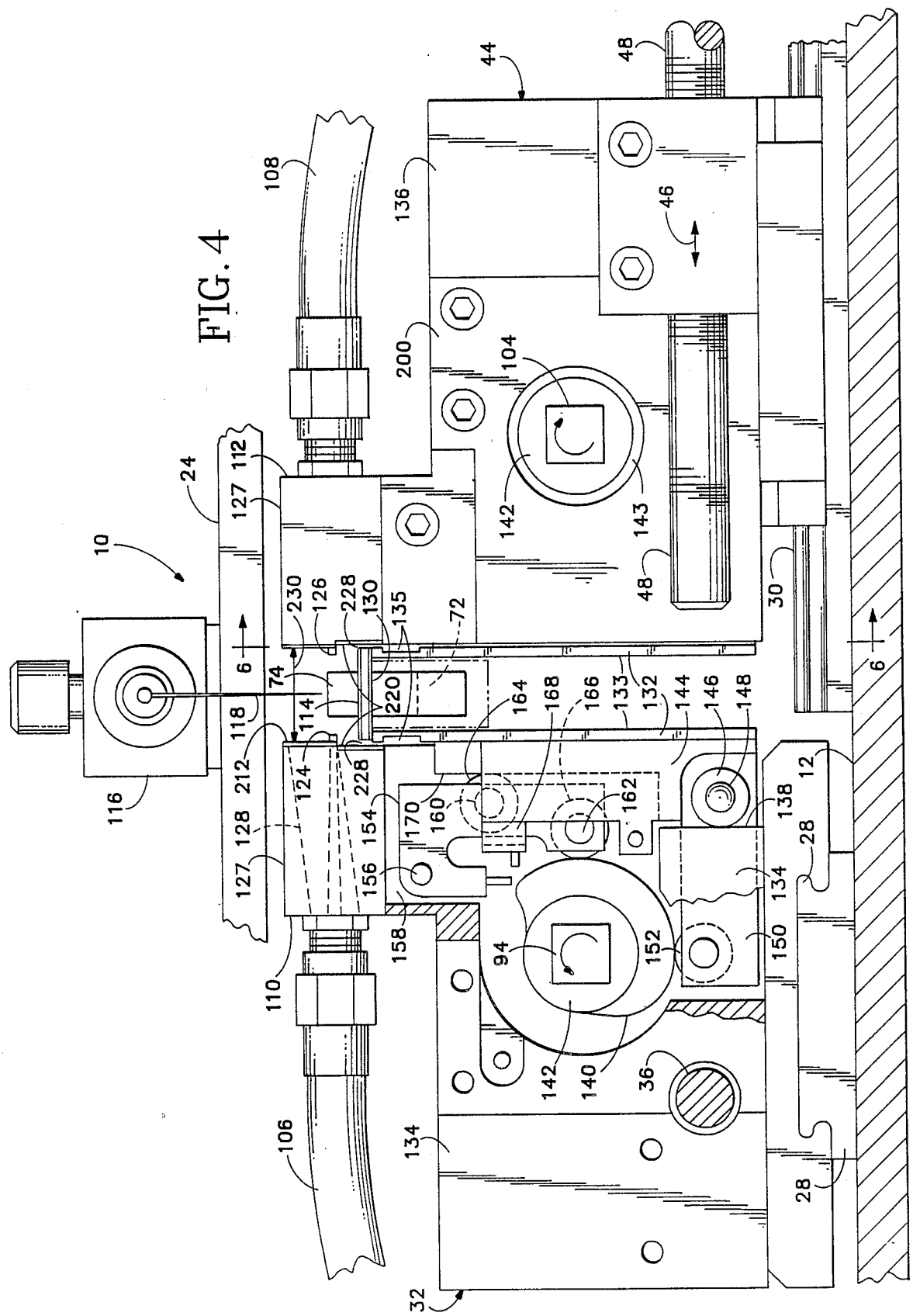
FIG. 4 is a partially cut-away sectional view, taken along line 3—3, of the portion of a test fixture shown in FIG. 2, at an enlarged scale.

As may be seen in FIGS. 3 and 4, the microstrip assembly 114 includes a substrate 120 of alumina or other suitable dielectric material, defining a pair of opposite main faces, and a conductor 122 is located on the upper one of the main faces.

Each of the launchers 110 and 112 includes an inner contact 124 or 126, respectively. The launchers 110 and 112 are generally similar, for example, to the launcher disclosed in Eisenhart U.S. Pat. No. 4,280,112, of which the disclosure is hereby incorporated herein by reference. The launchers 110 and 112 differ from the Eisenhart launcher, however, in having an outer conductor 127 which defines an angularly offset bore 128, while each of the inner contacts 124 and 126 is, respectively, an axially aligned extension of the inner conductor of the respective coaxial transmission cable 106 or 108.

The angularly offset bore 128 is provided in order to effect transition from coaxial conductors to the parallel conductors characteristic of a microstrip transmission line such as the microstrip assembly 114 without excessive amounts of reflected power which would invalidate measurements made with the use of the test fixture 10, as explained, in Eisenhart U.S. Pat. No. 4,280,112. However, the launchers 110 and 112 are easier to manufacture than the Eisenhart launcher, because of the collinearity of the inner contacts with the center conductors of the coaxial cables.

The carriages 32 and 44 include similar connector positioning mechanisms for the purpose of effecting electrical connection of an electronic circuit component such as the microstrip assembly 114 to the launchers 110 and 112 in a geometrically precise, electrically effective, and highly repeatable mode of connection, so that test results obtained through use of the test fixture of the invention on several similar devices will be equally valid and representative of the performance of each such device. The connector positioning mechanisms will be described with reference first to the Y-axis carriage 32. The X-axis carriage 44 includes a similar but oppositely-directed connector positioning mechanism for accomplishing connection of the launcher 112 to the opposite end of the transmission line of the microstrip assembly 114, as will be understood.

Figure 5:
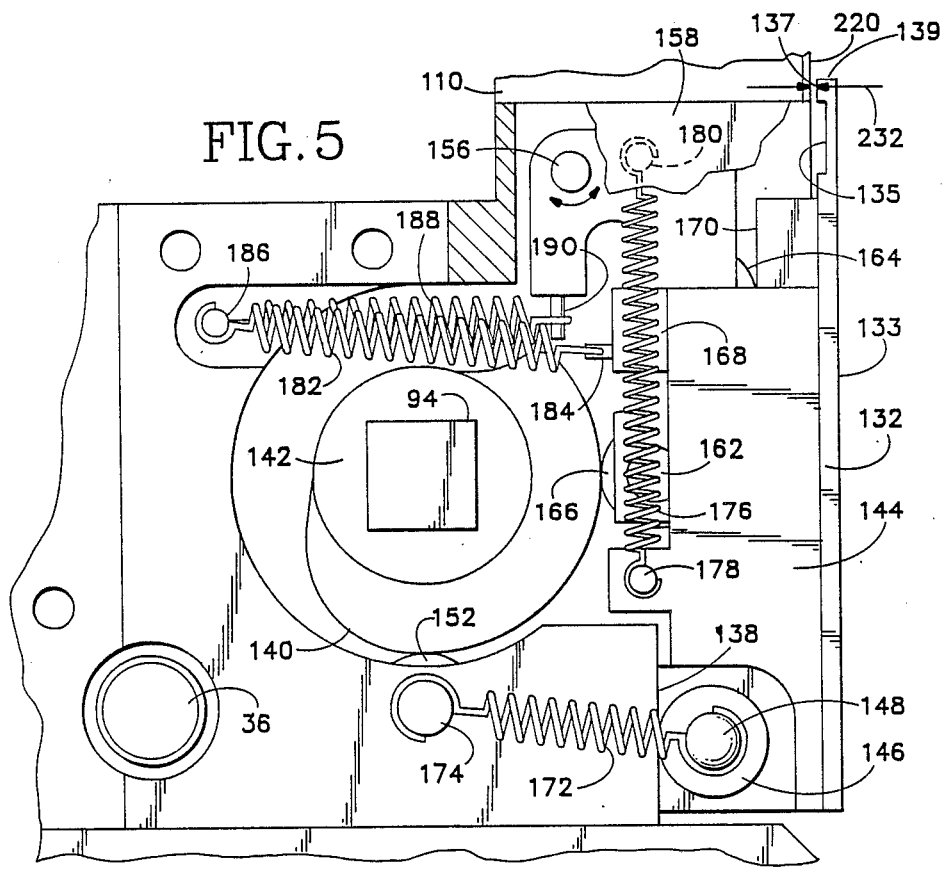
FIG. 5 is a partially cut-away detail view showing a portion of one of a pair of connector positioning mechanisms, at yet a further enlarged scale.
Figure 6:
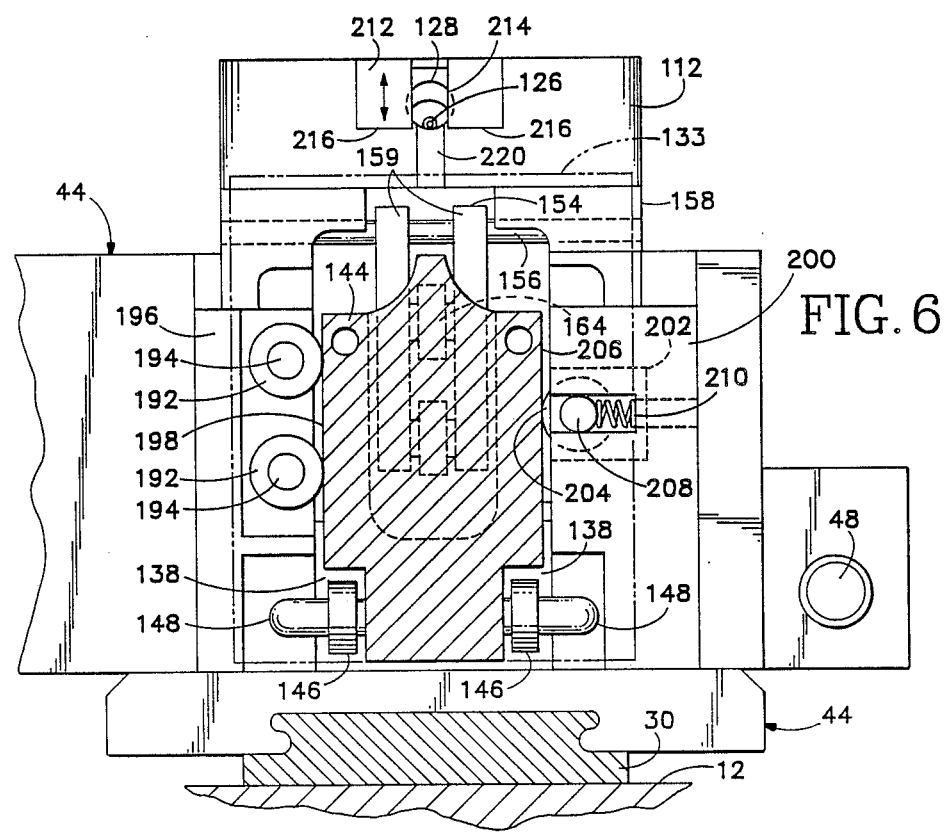
FIG. 6 is a sectional view of one of the connector positioning mechanisms, taken along line 5—5 of FIG. 3.

As may be seen with reference to FIGS. 4, 5, and 6, a connector positioning mechanism for effecting electrical connection with the ground plane conductor 130 on the underside 130 of the microstrip assembly 114 includes a respective slider 132 carried by each of the carriages 32 and 44. Each of the carriages 32 and 44 includes a respective main body 134 or 136 including a pair of forwardly extending legs located near the bottom of the respective main body. Each pair of such legs includes a pair of planar vertical faces 138 and helps to define a generally cylindrical space. A cam 140, defined on a sleeve 142 which fits longitudinally slidably on the respective one of the connector drive shafts 94 and 104, fits within the generally cylindrical space defined by the main body. The sleeve 142, and thus the cam 140, is mounted to rotate together with the respective connector drive shaft 94 or 104, as by provision of corresponding square shapes of the shaft and the bore in the sleeve 142, as shown. Suitable bearings 143 support the cam sleeve 142 and the associated shaft 94 or 104 with respect to the main body 134 or 136, respectively.

Each slider 132 includes a front plate 133 which extends vertically and laterally and faces forwardly, away from a rear body portion 144. The upper portion of the front plate 133 defines a shallow groove 135 on its rear face, that is, the side of the front plate 133 facing toward the respective launcher 110 or 112. Above the groove 135 is a narrow laterally oriented contact surface 137 facing toward the launcher. The front plate 133 also defines a horizontal upper contact surface 139 which extends perpendicular to the contact surface 137, and thus in an over-lapping direction with respect to the bottom face or ground plane conductor 130 of the microstrip assembly 114. The rear body 144 defines a pair of laterally separated recesses, one on each side, in which are located respective ones of a pair of small precision bearing assemblies which act as wheels 146, both wheels being carried on a single shaft 148 extending transversely through the rear body 144, with each of the wheels 146 being aligned and in contact with a respective one of the vertical faces 138. A central rearwardly extending leg 150 of the rear body portion 144 carries a similar bearing assembly which contacts the surface of the cam 140 as a follower wheel 152 to control vertical motion of the slider 132.

An arm assembly 154 is mounted on a pivot shaft 156, mounted in an upper body member 158, permitting the arm assembly 154 to rotate with respect to the upper body member 158. The arm assembly 154 includes a pair of parallel plates 159, seen best in FIG. 6, which are interconnected by a pair of transversely extending parallel shafts 160 and 162. Additional precision bearing assemblies acting as an upper wheel 164 and a lower wheel 166 are carried, respectively, on the shafts 160 and 162 between the plates 159. The arm assembly 154 is located partially within a recess defined in the rear body portion 144, where a retainer bracket 168 attaches the arm assembly 154 loosely to the rear body portion 144, permitting a small amount of horizontal movement and a relatively large amount of vertical movement of the slider 132 relative to the arm assembly 154. A generally vertically and transversely extending planar surface 170 is defined on the rear body 144, and the upper wheel 164 rolls along the surface 170 at certain times during the cycle of operation of the connector positioning mechanism. The bearing assembly 166 contacts the surface of the cam 140 as a follower to control pivoting of the arm assembly 154 about a pivot axis defined by the pivot shaft 156.

FIG. 5 shows various elongate helical tension springs which are omitted from FIGS. 4, 6, 7, and 8, in order to provide greater clarity in those views. These springs keep the various precision bearing assemblies, acting as wheels, appropriately in contact with respective surfaces on which they ride to control movement of the slider 132.

In particular, a tension spring 172 connects each end of the shaft 148 to a respective retaining pin 174 mounted in the adjacent one of the lower legs of the main body 134 or 136. The springs 172 thus hold the outer surface of each wheel 146 in contact with the respective vertical flat surface 138 on each side of the main body and of the slider 132.

A pair of vertically oriented tension springs 176 are located one on each side of the rear body 144 of the slider 132, extending generally vertically. A lower end of each spring 176 is attached to a respective pin 178 extending laterally from a rearward extension of the rear body 144. The upper end of each spring 176 is attached to a respective pin 180 extending laterally inwardly from a portion of the upper main body member 158, thus urging the slider 132 in an upward direction, as limited at times by contact of the bottom cam follower wheel 152 against the cam 140 (depending upon the position of the cam 140).

A pair of upper slider tension springs 182 extend rearward from respective pins 184 located at opposite laterally separated ends of the retainer bracket 168. Each of the upper slider tension springs 182 extends rearwardly to the respective end of a pin 186 extending transversely through a central web portion of the main body 134 or 136.

An arm assembly biasing spring 188 extends rearwardly from a pin 190 mounted on each of the plates 159 of the arm assembly 154. A rear end of each of the arm assembly biasing springs 188 is also attached to the pin 186 at a position located laterally inward from the respective upper slider tension spring 182 on each side of the respective main body 134 or 136. The arm assembly biasing springs 188 urge the arm assembly 154 to rotate about the pivot pin 156, biasing the lower wheel 166 of the arm assembly toward the surface of the cam 140. At the same time, the upper slider tension springs 182 urge the contact surfaces 137 and 139 of the slider 132 rearward toward a position providing contact between the upper wheel 164 of the arm assembly 154 and the flat vertical surface 170 on the rear body 144 of the slider.

The mechanisms of the connector positioning mechanism which have already been described control the movement of the slider 132 vertically and of the contact areas 137 and 139 in a generally horizontal direction parallel with, or overlapping a portion of the ground plane conductor on the underside of a microstrip assembly such as the microstrip device 114. It is also necessary to maintain the position of the slider 132 accurately in a lateral direction, in order to provide accurate control of the position of the slider 132 during repeated interconnection of the test fixture 10 to microstrip assemblies being tested. As shown in FIG. 6, additional stability in a lateral direction in the plane of the front plate 133 of the slider 132 is provided by a pair of precision bearing assemblies acting as wheels 192, which are carried on corresponding pins 194 mounted in a left side plate 196 of the connector positioning mechanism. The pins 194 are located directly above one another in the left side plate 196, and define horizontal forwardly extending axes of revolution for the wheels 192, which bear against a longitudinally extending vertical planar surface 198 defined on the left side of the rear body 144 of the slider 132.

A right side plate 200 is thicker than the left side plate 196 and defines a cavity 202 within which is located a precision bearing assembly acting as a wheel 104, which is held against a vertical flat surface 206 located on the side of the rear body 144 opposite the surface 198. The wheel 204 is rotatably mounted upon a shaft 208 which extends parallel with the pins 194. The shaft 208 is movable laterally toward the rear body 144, urged by a pair of helical compression springs 210 held in the right side plate 200 by fasteners such as grub screws (not shown) to urge the slider 132 toward the wheels 192 and thereby prevent undesired lateral movement.

As may best be seen in FIG. 6, the front face of the launcher 112, which is substantially identical to the launcher 110, includes a centrally located vertically adjustable stop 212 defining an open-bottomed rectangular slot 214 which partially exposes the open end of the bore 128. The adjustable stop 212 has a lower edge 216 which may be moved to a predetermined location relative to the respective inner contact 124 or 126, by means of a pair of adjustment bolts 218 (FIG. 3).

Centrally located beneath the adjustable stop 212 and aligned with the open end of the bore 128 is a flat vertical contact area 220 which protrudes forward a small distance with respect to the surrounding area of the launcher, yet does not protrude as far as the adjustable stop 212. The contact area 220 extends vertically the entire extent of the height of the launcher 112 below the opening of the bore 128, but extends laterally only a small distance, equal, for example, to the width of the opening of the bore 128. The narrow contact area 220 contributes to greater certainty of the location of electrical contact between the opposed surface of the horizontal contact 137 and the contact area 220, in connecting the ground plane conductor 130 located on the underside 130 of the microstrip assembly 114 to the outer conductor of the launcher.

OPERATION

By carefully and precisely carrying out a sequence of simple steps, electrical connection between the ground plane conductor 130 and the upper transmission line conductor 122 of a microstrip assembly 114 can be achieved reliably and with excellent repeatability. Test results thus obtained in tests of similar microstrip assemblies performed using a test fixture embodying the present invention, such as the test fixture 10 may validly be compared. Furthermore, a microstrip assembly 114 need not be supported by a carrier, although a carrier (not shown) may be used to support a microstrip assembly during testing, or a microstrip assembly may include a heat sink attached to the ground plane conductor 130 as shown in phantom in FIGS. 4, 7 and 8.

The test fixture 10 is prepared initially to be used in testing a particular type of circuit component assembly such as the microstrip assembly 114 by utilizing the knob 52 to rotate the threaded shaft 48 to move the X-axis carriage 44 along the X-axis track 30 to provide a sufficient distance 230 (FIG. 4) between the launchers 110 and 112 to permit the microstrip assembly 114 to be placed between the contact surfaces 220 of the oppositely facing launchers with slight gaps 228 provided. The locking knob 54 is then turned to hold the threaded shaft 48 and thereby retain the carriage 44 in that position.

The main operating lever 84 should be in a clockwise rotated position, seen looking toward the wall 16 from outside the frame as shown in FIG. 1, in which the cams 86 (FIG. 2) hold the carrier lid 24 in an upwardly inclined position. The driving bevel gears 88 and 90 will have rotated the driven bevel gears 92 and 102, thus rotating the connector drive shafts 94 and 104 to corresponding positions in which the cams 140 are positioned as shown in FIGS. 4 and 5. While the positions of the cams 140 are as shown in FIGS. 4 and 5, the sliders 132 are held in a lowered position by the cams 140 acting through the bottom follower wheels 152. The laterally extending vertical contact surface 137 is separated from the contact area 220 of the respective launcher by a separation distance 232 (FIG. 5), as a result of interaction of the lower wheel 166 of the arm assembly 154 against the surface of the cam 140. This holds the arm assembly pivoted against the force of the spring 188 to the position shown in FIGS. 4 and 5, bringing the upper wheel 164 to bear against the vertical flat surface 170 of the slider 132, moving the contact surface 137 away from the contact area 220 of the launcher.

With the sliders 132 in this lowered position, the microstrip assembly 114 which is to be tested is placed atop the sliders 132, resting atop the laterally extending horizontal contact surfaces 139, and with the microstrip assembly 114 held in contact with the fence 74. The knob 66 is then rotated to turn the threaded shaft 62 and thereby to move the fence carriage 58 along the fence carriage track 56 to move the microstrip assembly 114 which is to be tested until the conductor 122 on the upper main face of the microstrip assembly is aligned correctly with the inner contact 126 of the launcher 112. The fence 74 thus acts as an adjustable stop to establish the proper position for placement of a device on the sliders 132 to be in proper alignment with the launchers. In accomplishing such alignment using the fence 74, it may be desirable to rotate the main operating lever 84 counterclockwise a slight distance to raise the sliders 132 slightly to bring the conductor 122 closer to the inner contact 126. The manner in which such rotation of the main operating lever 84 accomplishes such raising of the sliders 132 will be explained more fully presently.

The threaded shaft 62 connected with the fence carriage 58 is then locked in the necessary position by utilization of the fence locking knob 68. Thereafter, the position of the Y-axis carriage 32 is adjusted along the Y-axis track 28 by utilizing the Y-axis positioning knob 40 to rotate the threaded shaft 36 to bring the inner contact 124 into alignment above the end of the microstrip conductor 122 adjacent the launcher 110. The opposite ends of the microstrip conductor 122 may be directly opposite one another on the upper surface of the microstrip circuit component assembly 114, or one end of the conductor 122 may be offset from the other as indicated in broken line in FIG. 3. Once the position of the Y-axis carriage 32 has thus been adjusted, the threaded shaft 36 is locked in position by use of the Y-axis locking knob 42.

Figure 7:
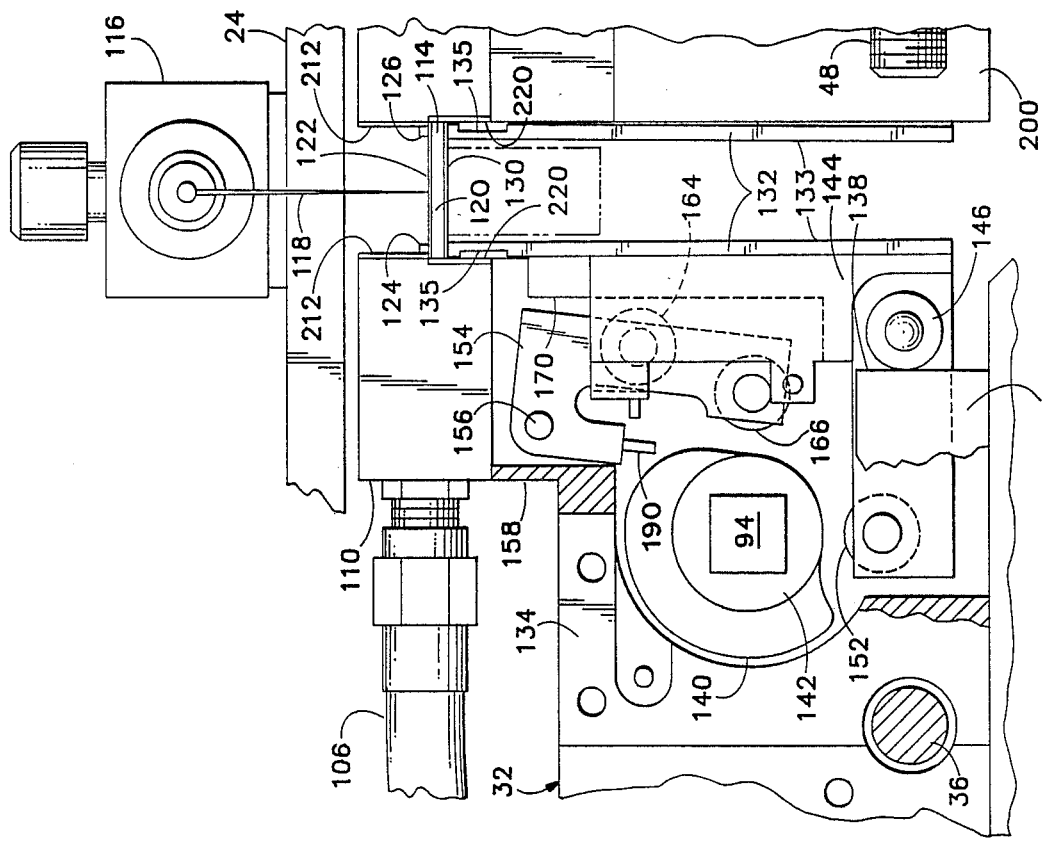
FIG. 7 is a view similar to the left portion of FIG. 3, showing the connector positioning mechanism when a microstrip assembly has been raised into contact with an inner conductor of each of a pair of launchers.

Once the position of the Y-axis carriage 32 has been adjusted, and assuming that the main operating lever 84 has not been turned to raise the sliders 132 during alignment of the position of the microstrip circuit component assembly 114 with respect to the inner contacts 124 and 126, the main operating lever 84 is rotated through an angle of 90° in a counterclockwise direction, resulting in rotation of the Y-axis connector drive shaft 94 in a counterclockwise direction to the position shown in FIG. 7, and a corresponding simultaneous clockwise rotation of the X-axis connector drive shaft 104, as indicated by arrows in FIG. 4.

With the cams 140 both in the position shown in FIG. 7, the sliders 132 are no longer held in the lowered position by the cams' action against the lower cam follower wheels 152. The springs 176 raise both of the sliders 132, together with the microstrip assembly 114 carried thereon as the cams permit during their rotation, until the inner contacts 124 and 126 and the bottom edge 216 of each of the adjustable stops 212 bear upon the conductor 122 and adjacent surfaces of the upper face of the substrate 120, limiting upward movement of the sliders 132. As the sliders 132 move upwardly, the wheels 146 and 164 roll upwardly along the vertical surfaces 138 and 170, respectively, so that the sliders 132 move directly upwardly to the position shown in FIG. 7. The separation distance 232 between the laterally extending vertical contact surface 137 and the contact surfaces 220 of the launchers 110 and 112 is still maintained at this point.

Once the sliders 132 have raised the microstrip assembly 114 into contact with the inner contacts 124 and 126, the threaded shaft 48 is unlocked and the knob 52 is again utilized to adjust the position of the X-axis carriage 44 along the X-axis track 30, toward the Y-axis carriage 32, to close the gaps 228 which were left previously between the launcher assemblies 110 and 112 and the microstrip assembly 114. The threaded shaft 48 is then again locked in position using the locking knob 54.

Thereafter the main operating lever 84 is once more rotated approximately 90 degrees counterclockwise. This rotation of the main operating lever 84 turns the main operating control shaft 76 and the cams 86 carried thereupon, lowering the carrier lid 24, and with it the probe assembly 116, bringing the probe contact 118 into electrical contact with a desired position on the upper face of the microstrip assembly 114. Preferably, the probe assembly 116 will have previously been adjusted to prevent the probe contact 118 from making physical contact with the microstrip circuit assembly 114 which is the first of a series of similar microstrip assemblies to be tested, and the adjustment knobs of the probe assembly 116 may then be utilized to bring the probe contact 118 into the desired position so that for subsequent similar microstrip assemblies the contact 118 will automatically come to rest in contact with the proper part of the microstrip assembly.

Figure 8:
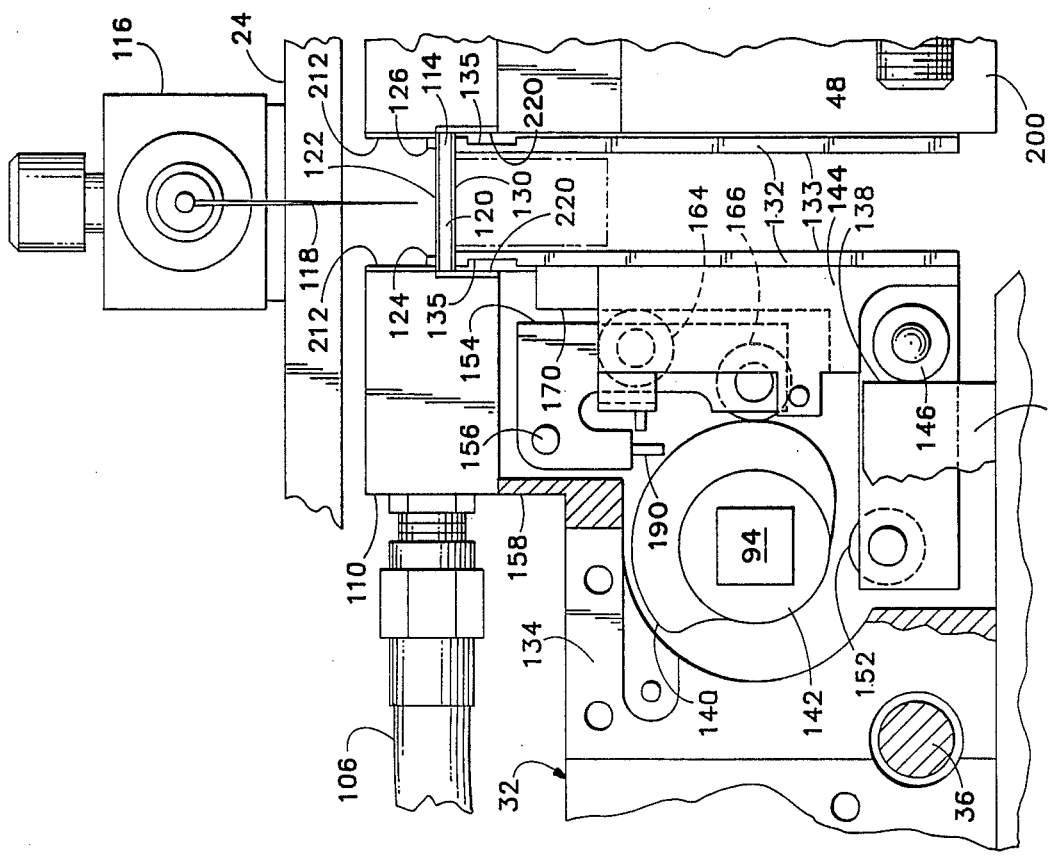
FIG. 8 is a view similar to FIG. 7, but showing the connector circuit positioning mechanism having brought the connector into position to connect a ground plane conductor of a microstrip assembly with the outer conductor of each of a launcher.

While the lowering of the carrier lid 24 and the probe assembly 116 carried thereupon is the most obviously noticeable action which occurs as the operating lever is rotated as mentioned previously, the rotation of the main operating control shaft 76 also causes further 90° of rotation of the connector drive shafts 94 and 104 and both of the cams 140, to the position shown in FIG. 8 for the connector positioning mechanism included in the Y-axis carriage 32. As a result of this further rotation of the cams 140, the arm assembly 154 is allowed to rotate (clockwise, as shown in FIG. 8) under the influence of the arm assembly biasing springs 188 (FIG. 5) acting on the pins 190. As the arm assembly 154 rotates about the pivot shaft 156, the upper wheel 164 moves rearwardly, away from the vertical flat surface 170 of the rear body portion 144 of each slider 132. The upper slider tension springs 182 (FIG. 5), then act through the pins 184, to pull the upper portion of each slider 132 rearwardly, so that the slider 132 pivots through a very small angle about an axis defined by the shaft 148.

As the slider 132 pivots, the upper end of the front plate 133 moves substantially horizontally rearwardly under the influence of the upper slider tension springs 182, and the horizontal contact surface 139 slides a small distance along the surface of the ground plane conductor on the bottom face of the microstrip assembly 114, closing the separation distance 232. The laterally extending vertical contact surface 137 of the front plate 133 is thus brought into physical contact with the contact surface 220 on the respective launcher assembly 110 or 112, where the upper slider tension springs 182 maintain a force urging the contact surfaces 137 and 220 into electrical contact with one another, with the vertical extent of the contact surface 220 making different thicknesses of substrates 120 unimportant. The upper portion of the front plate 133 acts as a connector and conductor to make electrical connection simultaneously with both the horizontal extending ground plane conductor 130 of the microstrip assembly 114 and the vertical contact surface 220 which is a part of the outer conductor of the respective launcher assembly 110 or 112. The springs 176 assure that contact is made with a similar amount of pressure of the horizontal contact surface 139 against the ground plane conductor 130 on the bottom face of each of several similar microstrip assemblies. The springs 182 act likewise to accomplish connection with similar pressure between the contact surface 137 and the contact surface 220, in a closely similar location with respect to each of several microstrip assemblies 114 which are tested serially utilizing the test fixture 10 of the present invention.

After a microstrip assembly 114 has thus been connected to the test fixture, desired testing may be carried out utilizing transmission of signals through the coaxial cables 106 and 108, as well as the probe assembly 116. Thereafter, disconnection is accomplished by reversal of the steps described for accomplishing connection of a microstrip assembly 114 to the test fixture 10. Clockwise rotation of the main operating shaft 76 first moves the connector portions of the slider horizontally, in the direction in which the contact surface 139 overlaps the ground plane conductor 130, until the contact surfaces 137 are separated from the contact surfaces 220 of the launchers. Thereafter, the sliders are lowered by action of the cams 140 as the shaft 76 is rotated further, disconnecting the microstrip assembly from the inner conductor contacts 124 and 126, and leaving the sliders 132 in their lowered position ready to accept another similar microstrip assembly.

It will be appreciated that during vertical movement of the sliders 132 with respect to the carriages 32 and 44 there is no sliding contact to cause wear on the rear side of the front plate 133 and the contact area 220 of the respective launcher assemblies. Maintenance of the separation distance 232 during raising and lowering of assemblies to be tested thus contributes to repeatability of the electrical connections made to a microstrip assembly 114 utilizing a test fixture according to the present invention.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A test fixture, for testing a microstrip assembly comprising a dielectric substrate with first and second main faces on opposite sides thereof and having first and second conductors on said first and second main faces, respectively, said fixture comprising:
   (a) launcher means for detachably electrically interconnecting said microstrip assembly with a coaxial transmission line, said launcher means having an inner conductor for detachably electrically connecting to said first conductor of said microstrip assembly and having an outer conductor defining substantially flat contact surface means for detachably electrically connecting to said second conductor of said microstrip assembly; and
   (b) connector means associated movably with said launcher means for detachably electrically connecting said outer conductor of said launcher means to said second conductor of said microstrip assembly, said connector means having respective substantially flat surface means for extending in an overlapping direction substantially parallel to said second main face of said microstrip assembly and for extending perpendicular to said contact surface means so as to detachably abut said second conductor along said overlapping direction when said launcher means is electrically connected to said microstrip assembly.

2. The apparatus of claim 1, further including connector positioning means, interconnecting said launcher means and said connector means, for selectively moving said connector means relative to said launcher means to connect said outer conductor electrically to said second conductor or, alternatively, disconnect said outer conductor electrically from said second conductor.

3. The apparatus of claim 2 wherein said connector positioning means includes means for moving said connector means relative to said launcher means substantially along said overlapping direction.

4. The apparatus of claim 2 wherein said connector positioning means includes means for moving said connector means relative to said launcher means substantially perpendicular to said overlapping direction.

5. The apparatus of claim 2 wherein said connector positioning means includes means for moving said connector means relative to said launcher means both substantially along said overlapping direction and substantially perpendicular to said overlapping direction.

6. The apparatus of claim 5 wherein said connector positioning means includes means for moving said connector means relative to said launcher means substantially along said overlapping direction and substantially perpendicular to said overlapping direction in a predetermined sequence.

7. The apparatus of claim 6 wherein said connector positioning means includes means for moving said connector means relative to said launcher means first substantially perpendicular to said overlapping direction and then substantially along said overlapping direction to connect said outer conductor electrically to said second conductor.

8. The apparatus of claim 2 wherein said connector positioning means further includes means for supportively moving said microstrip assembly relative to said launcher means so as to move said first conductor of said microstrip assembly into electrical connection with said inner conductor of said launcher means.

9. The apparatus of claim 1, further including a second launcher means in opposed relationship to the first launcher means and separated therefrom by a distance, for detachably electrically interconnecting said microstrip assembly with a second coaxial transmission line, said second launcher means having respective inner and outer conductors and said connector means including means for detachably electrically connecting the outer conductor of said second launcher means to said second conductor of said microstrip assembly.

10. The apparatus of claim 9, including means for adjustably varying said distance between the respective first and second launcher means.

11. The apparatus of claim 9, including means for varying the relationship of said respective first and second launcher means in a direction transverse to said distance.

12. The apparatus of claim 9, further including adjustable stop means movable transversely to said distance for positioning said microstrip assembly along a direction transverse to said distance.

13. The apparatus of claim 9, including connector positioning means for moving said connector means relative to said respective first and second launcher means, and means for moving said respective first and second launcher means relative to each other, said connector means having a pair of connector components, each connected to a respective one of said first and second launcher means so as to move in unison with its respective launcher means.

14. The apparatus of claim 13 wherein each of said pair of connector components is movably connected to its respective launcher means, further including means interconnecting said pair of connector components for synchronizing their respective movements relative to their respective launcher means.

15. The apparatus of claim 1 wherein said connector means includes resilient means for yieldably applying contact pressure to said second conductor substantially perpendicularly to said overlapping direction so as to compensate for different thicknesses of said microstrip assembly.

16. The apparatus of claim 1 wherein said connector means includes resilient means for yieldably applying contact pressure to said outer conductor of said launcher means substantially along said overlapping direction.

17. A test fixture, for testing a microstrip assembly comprising a dielectric substrate with first and second main faces on opposite sides thereof and having first and second conductors on said first and second main faces, respectively, said fixture comprising:
(a) launcher means for detachably electrically interconnecting said microstrip assembly with a coaxial transmission line, said launcher means having an inner conductor for detachably electrically connecting to said first conductor of said microstrip assembly, and having an outer conductor with a contact surface for detachably electrically connecting to said second conductor with said contact surface oriented substantially perpendicular to said second main face of said dielectric substrate;
(b) connector means for detachably electrically connecting said contact surface of said outer conductor of said launcher means to said second conductor of said microstrip assembly by contacting both said contact surface and said second conductor; and
(c) connector positioning means for moving said connector means in directions both substantially perpendicular to and substantially parallel to said second main face when said second main face and said contact surface are substantially perpendicular to each other, so as to move said connector means into contact with both said contact surface and said second conductor.

18. The apparatus of claim 17, wherein said connector positioning means includes means for moving said connector means toward said second main face and toward said contact surface by moving said connector means in two different directions substantially perpendicular to each other in a predetermined sequence.

19. A test fixture, for testing a microstrip assembly comprising a dielectric substrate with first and second main faces on opposite sides thereof and having first and second conductors on said first and second main faces, respectively, said fixture comprising:
(a) launcher means for detachably electrically interconnecting said microstrip assembly with a coaxial transmission line, said launcher means having an inner conductor for detachably electrically connecting to said first conductor of said microstrip assembly, and having an outer conductor with a contact surface for detachably electrically connecting to said second conductor with said contact surface oriented substantially perpendicular to said second main face of said dielectric substrate;
(b) connector means for detachably electrically connecting said contact surface of said outer conductor of said launcher means to said second conductor of said microstrip assembly by contacting both said contact surface and said second conductor; and
(c) connector positioning means for moving said connector means in a direction substantially parallel to said contact surface while simultaneously preventing contact between said connector means and said contact surface and, sequentially thereafter, permitting contact between said connector means and said contact surface.

20. The apparatus of claim 19 wherein said connector positioning means comprises means for permitting movement of said outer conductor of said launcher in a direction substantially perpendicular to said contact surface while preventing contact between said connector means and said contact surface.

21. A test fixture, for testing a microstrip assembly comprising a dielectric substrate with first and second main faces on opposite sides thereof and having first and second conductors on said first and second main faces, respectively, said fixture comprising:
  (a) launcher means for detachably electrically interconnecting said microstrip assembly with a coaxial transmission line, said launcher means having an inner conductor for detachably electrically connecting to said first conductor of said microstrip assembly, and having an outer conductor for detachably electrically connecting to said second conductor of said microstrip assembly;
  (b) microstrip support means for supporting said microstrip assembly while said inner and outer conductors of said launcher means are electrically connected to said first and second conductors of said microstrip assembly;
  (c) said microstrip support means including means for selectively moving said microstrip assembly alternatively into and out of electrical connection with said launcher means along a direction substantially perpendicular to said first and second main faces of said dielectric substrate of said microstrip assembly, said microstrip support means further including resilient means for yieldably supporting said microstrip assembly in said direction so as to compensate for different thicknesses of said microstrip assembly.

22. A test fixture, for testing a microstrip assembly comprising a dielectric substrate with first and second main faces on opposite sides thereof and having first and second conductors on said first and second main faces, respectively, said fixture comprising:
  (a) a base;
  (b) respective first and second oppositely-facing launcher means for detachably electrically interconnecting said microstrip assembly with a pair of coaxial transmission lines, each of said launcher means having an inner conductor for detachably electrically connecting to said first conductor and an outer conductor for detachably electrically connecting to said second conductor;
  (c) means connecting said first launcher means to said base for adjustably reciprocating said first launcher means along an axis extending toward the second one of said launcher means; and
  (d) means connecting said second launcher means to said base for adjustably reciprocating said second launcher means in a direction transverse to said axis.

23. The apparatus of claim 22, further including microstrip positioning means for positioning said microstrip assembly between said first and second launcher means, and means connecting said microstrip positioning means to said base for adjustably moving said microstrip positioning means in a direction transverse to said axis.

24. A test fixture, for testing a microstrip assembly comprising a dielectric substrate with first and second main faces on opposite sides thereof and having first and second conductors on said first and second main faces, respectively, said fixture comprising:
  (a) a pair of opposed launcher means for detachably electrically interconnecting said microstrip assembly with a pair of coaxial transmission lines, each of said launcher means having an inner conductor for detachably electrically connecting to said first conductor of said microstrip assembly, and having an outer conductor for detachably electrically connecting to said second conductor of said microstrip assembly;
  (b) microstrip support means for supporting said microstrip assembly while said inner and outer conductors of said pair of launcher means are electrically connected to said first and second conductors of said microstrip assembly;
  (c) said microstrip support means including means for selectively moving said microstrip assembly alternatively into and out of electrical connection with said pair of launcher means;
  (d) said microstrip support means further including probe-supporting means for automatically moving a probe alternatively into and out of electrical connection with said microstrip assembly while said microstrip assembly is correspondingly moved into and out of electrical connection with said launcher means by said microstrip support means.

25. A test fixture, for testing a microstrip assembly comprising a dielectric substrate with first and second main faces on opposite sides thereof and having first and second conductors on said first and second main faces, respectively, said fixture comprising:
  (a) launcher means for detachably electrically interconnecting said microstrip assembly with a coaxial transmission line, said launcher means having an inner conductor for detachably electrically connecting to said first conductor of said microstrip assembly and having an outer conductor for detachably electrically connecting to said second conductor of said microstrip assembly;
  (b) connector means connected to said launcher means for detachably electrically connecting said outer conductor of said launcher means to said second conductor of said microstrip assembly, said connector means having substantially flat surface means for extending in an overlapping direction substantially parallel to said second main face of said microstrip assembly so as to detachably abut said second conductor along said overlapping direction when said launcher means is electrically connected to said microstrip assembly, said connector means and said outer conductor of said launcher means having mating, relatively movable electrical contact surfaces; and
  (c) connector positioning means, interconnecting said launcher means and said connector means, for selectively moving said connector means relative to said launcher means to connect said outer conductor electrically to said second conductor or, alternatively, disconnect said outer conductor electrically from said second conductor, said connector positioning means including means for preventing electrical contact between said electrical contact surfaces while moving said connector means relative to said launcher means.

26. A test fixture, for testing a microstrip assembly comprising a dielectric substrate with first and second main faces on opposite sides thereof and having first and second conductors on said first and second main faces, respectively, said fixture comprising:
(a) launcher means for detachably electrically interconnecting said microstrip assembly with a coaxial transmission line, said launcher means having an inner conductor for detachably electrically connecting to said first conductor of said microstrip assembly and having an outer conductor for detachably electrically connecting to said second conductor of said microstrip assembly;
(b) connector means connected to said launcher means for detachably electrically connecting said outer conductor of said launcher means to said second conductor of said microstrip assembly, said connector means having substantially flat surface means for extending in an overlapping direction substantially parallel to said second main face of said microstrip assembly so as to detachably abut said second conductor along said overlapping direction when said launcher means is electrically connected to said microstrip assembly, said connector means and said outer conductor of said launcher means having mating, relatively movable electrical contact surfaces; and
(c) connector positioning means, interconnecting said launcher means and said connector means, for selectively moving said connector means relative to said launcher means to connect said outer conductor electrically to said second conductor or, alternatively, disconnect said outer conductor electrically from said second conductor wherein said electrical contact surfaces are relatively movable along a direction of movement substantially parallel to said contact surfaces, a first one of said contact surfaces having a dimension along said direction of movement which is greater than the dimension of the second contact surface along said direction of movement.

27. A test fixture, for testing a microstrip assembly comprising a dielectric substrate with first and second main faces on opposite sides thereof and having first and second conductors on said first and second main faces, respectively, said fixture comprising:
(a) first launcher means for detachably electrically interconnecting said microstrip assembly with a coaxial transmission line, said launcher means having an inner conductor for detachably electrically connecting to said first conductor of said microstrip assembly and having no outer conductor for detachably electrically connecting to said second conductor of said microstrip assembly;
(b) connector means connected to said launcher means for detachably electrically connecting said outer conductor of said launcher means to said second conductor of said microstrip assembly, said connector means having substantially flat surface means for extending in an overlapping direction substantially parallel to said second main face of said microstrip assembly so as to detachably abut said second conductor along said overlapping direction when said launcher means is electrically connected to said microstrip assembly;
(c) second launcher means in opposed relationship to the first launcher means and separated therefrom by a distance, for detachably electrically interconnecting said microstrip assembly with a second coaxial transmission line, said second launcher means having respective inner and outer conductors and said connector means including means for detachably electrically connecting the outer conductor of said second launcher means to said second conductor of said microstrip assembly; and
(d) means for adjustably varying said distance between said first and second launcher means.

28. A test fixture, for testing a microstrip assembly comprising a dielectric substrate with first and second main faces on opposite sides thereof and having first and second conductors on said first and second main faces, respectively, said fixture comprising:
(a) first launcher means for detachably electrically interconnecting said microstrip assembly with a coaxial transmission line, said launcher means having an inner conductor for detachably electrically connecting to said first conductor of said microstrip assembly and having an outer conductor for detachably electrically connecting to said second conductor of said microstrip assembly;
(b) connector means connected to said launcher means for detachably electrically connecting said outer conductor of said launcher means to said second conductor of said microstrip assembly, said connector means having substantially flat surface means for extending in an overlapping direction substantially parallel to said second main face of said microstrip assembly so as to detachably abut said second conductor along said overlapping direction when said launcher means is electrically connected to said microstrip assembly;
(c) second launcher means in opposed relationship to the first launcher means and separated therefrom by a distance, for detachably electrically interconnecting said microstrip assembly with a second coaxial transmission line, said second launcher means having respective inner and outer conductors and said connector means including means for detachably electrically connecting the outer conductor of said second launcher means to said second conductor of said microstrip assembly; and
(d) adjustable stop means movable transversely to said distance for positioning said microstrip assembly along a direction transverse to said distance.

29. A test fixture, for testing a microstrip assembly comprising a dielectric substrate with first and second main faces on opposite sides thereof and having first and second conductors on said first and second main faces, respectively, said fixture comprising:
(a) first launcher means for detachably electrically interconnecting said microstrip assembly with a coaxial transmission line, said launcher means having an inner conductor for detachably electrically connecting to said first conductor of said microstrip assembly and having an outer conductor for detachably electrically connecting to said second conductor of said microstrip assembly;
(b) connector means connected to said launcher means for detachably electrically connecting said outer conductor of said launcher means to said second conductor of said microstrip assembly, said connector means having substantially flat surface means for extending in an overlapping direction substantially parallel to said second main face of said microstrip assembly so as to detachably abut said second conductor along said overlapping direction when said launcher means is electrically connected to said microstrip assembly;
(c) second launcher means in opposed relationship to the first launcher means and separated therefrom by a distance, for detachably electrically interconnecting said microstrip assembly with a second coaxial transmission line, said second launcher means having respective inner and outer conductors and said connector means including means for detachably electrically connecting the outer conductor of said second launcher means to said second conductor of said microstrip assembly;
(d) connector positioning means for moving said connector means relative to said respective first and second launcher means;
(e) means for moving said respective first and second launcher means relative to each other, said connector means having a pair of connector components, each connected to a respective one of said first and second launcher means so as to move in unison with its respective launcher means, wherein each of said pair of connector components is movably connected to its respective launcher means; and
(f) means interconnecting said pair of connector components for synchronizing their respective movements relative to their respective launcher means.

30. A test fixture, for testing a microstrip assembly comprising a dielectric substrate with first and second main faces on opposite sides thereof and having first and second conductors on said first and second main faces, respectively, said fixture comprising:
(a) launcher means for detachably electrically interconnecting said microstrip assembly with a coaxial transmission line, said launcher means having an inner conductor for detachably electrically connecting to said first conductor of said microstrip assembly and having an outer conductor for detachably electrically connecting to said second conductor of said microstrip assembly; and
(b) connector means connected to said launcher means for detachably electrically connecting said outer conductor of said launcher means to said second conductor of said microstrip assembly, said connector means having substantially flat surface means for extending in an overlapping direction substantially parallel to said second main face of said microstrip assembly so as to detachably abut said second conductor along said overlapping direction when said launcher means is electrically connected to said microstrip assembly, wherein said connector means includes resilient means for yieldably applying contact pressure to said outer conductor of said launcher means substantially along said overlapping direction.

31. A test fixture, for testing a microstrip assembly comprising a dielectric substrate with first and second main faces on opposite sides thereof and having first and second conductors on said first and second main faces, respectively, said fixture comprising:
(a) launcher means for detachably electrically interconnecting said microstrip assembly with a coaxial transmission line, said launcher means having an inner conductor for detachably electrically connecting to said first conductor of said microstrip assembly, and having an outer conductor with a contact surface for detachably electrically connecting to said second conductor with said contact surface oriented substantially perpendicular to said second main face of said dielectric substrate;
(b) connector means for detachably electrically connecting said contact surface of said outer conductor of said launcher means to said second conductor of said microstrip assembly by contacting both said contact surface and said second conductor; and
(c) connector positioning means for moving said connector means in directions both substantially perpendicular to and substantially parallel to said second main face when said second main face and said contact surface are substantially perpendicular to each other, so as to move said connector means into contact with both said contact surface and said second conductor, said connector positioning means further including means for moving said microstrip assembly in a direction toward said inner conductor of said launcher means while simultaneously moving said connector means toward said second main face; and
(d) sequencing means, included in said connector positioning means, for moving said connector means toward said second main face and toward said contact surface by moving said connector means in two different directions substantially perpendicular to each other in a predetermined sequence, said sequencing means comprising means for moving said connector means toward said second main face before moving said connector means toward said contact surface, and for preventing contact of said connector means with said contact surface while moving said connector means toward said second main face.

32. A test fixture, for testing a microstrip assembly comprising a dielectric substrate with first and second main faces on opposite sides thereof and having first and second conductors on said first and second main faces, respectively, said fixture comprising:
(a) launcher means for detachably electrically interconnecting said microstrip assembly with a coaxial transmission line, said launcher means having an inner conductor for detachably electrically connecting to said first conductor of said microstrip assembly, and having an outer conductor with a contact surface for detachably electrically connecting to said second conductor with said contact surface oriented substantially perpendicular to said second main face of said dielectric substrate;
(b) connector means for detachably electrically connecting said contact surface of said outer conductor of said launcher means to said second conductor of said microstrip assembly by contacting both said contact surface and said second conductor; and
(c) connector positioning means for moving said connector means in directions both substantially perpendicular to and substantially parallel to said second main face when said second main face and said contact surface are substantially perpendicular to each other, so as to move said connector means into contact with both said contact surface and said second conductor, said connector positioning means further including means for moving said microstrip assembly in a direction toward said inner conductor of said launcher means while simultaneously moving said connector means toward said second main face.

33. A test fixture, for testing a microstrip assembly comprising a dielectric substrate with first and second main faces on opposite sides thereof and having first and second conductors on said first and second main faces, respectively, said fixture comprising:
- (a) launcher means for detachably electrically interconnecting said microstrip assembly with a coaxial transmission line, said launcher means having an inner conductor for detachably electrically connecting to said first conductor of said microstrip assembly and having an outer conductor for detachably electrically connecting to said second conductor of said microstrip assembly;
- (b) connector means connected to said launcher means for detachably electrically connecting said outer conductor of said launcher means to said second conductor of said microstrip assembly, said connector means having substantially flat surface means for extending in an overlapping direction substantially parallel to said second main face of said microstrip assembly so as to detachably abut said second conductor along said overlapping direction when said launcher means is electrically connected to said microstrip assembly;
- (c) connector positioning means, interconnecting said launcher means and said connector means, for selectively moving said connector means relative to said launcher means to connect said outer conductor electrically to said second conductor or, alternatively, disconnect said outer conductor electrically from said second conductor; and
- (d) means, included in said connector positioning means, for moving said connector means relative to said launcher means substantially along said overlapping direction while initially making connection of said outer conductor electrically with said second conductor.

34. The apparatus of claim 1, further including connector positioning means, interconnecting said launcher means and said connector means, for selectively moving said connector means relative to said launcher means to connect said outer conductor electrically to said second conductor or, alternatively, disconnect said outer conductor electrically from said second conductor, wherein said connector means and said outer conductor of said launcher means have mating, relatively movable electrical contact surfaces and wherein said electrical contact surfaces are relatively movable along a direction of movement substantially parallel to said contact surfaces, a first one of said contact surfaces having a dimension along said direction of movement which is greater than the dimension of the second contact surface along said direction of movement.

35. The apparatus of claim 34 wherein the second contact surface has a dimension perpendicular to said direction of movement which is greater than the dimension of the first contact surface perpendicular to said direction of movement.

36. The apparatus of claim 26 wherein the second contact surface has a dimension perpendicular to said direction of movement which is greater than the dimension of the first contact surface perpendicular to said direction of movement.

* * * * *

UNITED STATES PATENT AND TRADEMARK OFFICE
CERTIFICATE OF CORRECTION

PATENT NO. : 4,961,050

DATED : October 2, 1990

INVENTOR(S) : Warren K. Harwood et al.

It is certified that error appears in the above-identified patent and that said Letters Patent is hereby corrected as shown below:

Col. 17, line 52    Change "no" to --an--.

Signed and Sealed this

Ninth Day of June, 1992

Attest:

DOUGLAS B. COMER

*Attesting Officer*    Acting Commissioner of Patents and Trademarks